United States Patent [19]

Okumura et al.

[11] Patent Number: 4,635,229
[45] Date of Patent: Jan. 6, 1987

[54] SEMICONDUCTOR MEMORY DEVICE INCLUDING NON-VOLATILE TRANSISTOR FOR STORING DATA IN A BISTABLE CIRCUIT

[75] Inventors: Koichiro Okumura; Takeshi Watanabe, both of Tokyo, Japan

[73] Assignee: NEC Corporation, Japan

[21] Appl. No.: 692,087

[22] Filed: Jan. 17, 1985

[30] Foreign Application Priority Data

Jan. 18, 1984 [JP] Japan .................................. 59-6606

[51] Int. Cl.⁴ ............................................ G11C 11/40
[52] U.S. Cl. .................... 365/154; 365/182; 365/190
[58] Field of Search ............... 365/174, 182, 184, 185, 365/154, 156, 228, 190

[56] References Cited

U.S. PATENT DOCUMENTS

| | | | |
|---|---|---|---|
| 4,091,460 | 5/1978 | Schuermeyer et al. | 365/154 |
| 4,132,904 | 1/1979 | Harari | 365/228 |
| 4,207,615 | 6/1980 | Mar | 365/228 |
| 4,271,487 | 6/1981 | Craycraft et al. | 365/182 |
| 4,388,704 | 6/1983 | Bertin et al. | 365/185 |
| 4,420,821 | 12/1983 | Hoffman | 365/185 |
| 4,499,560 | 2/1985 | Brice | 365/228 |
| 4,510,584 | 4/1985 | Dias et al. | 365/189 |
| 4,541,073 | 9/1985 | Brice et al. | 365/228 |

Primary Examiner—Terrell W. Fears

Attorney, Agent, or Firm—Sughrue, Mion, Zinn, Macpeak, and Seas

[57] ABSTRACT

A non-volatile random access memory device includes a plurality of memory cells, each of which has a bistable (flip-flop) circuit which acts as an ordinary random access memory cell and at least one non-volatile memory transistor. The bistable circuit has two output terminals (a true output terminal and a complementary output terminal). One of the two output terminals is coupled to a control electrode of the non-volatile memory transistor, and the other output terminal is coupled to the drain of the non-volatile memory transistor. The source of the non-volatile memory transistor is coupled to a driving voltage source (e.g. 5 $\overline{V}$) via a switching gate which is turned on when a control signal is applied thereto. In a normal operation mode, a normal driving voltage (e.g. 5 $\overline{V}$) is supplied to the bistable circuit. On the other hand, when data in the bistable circuit is to be sheltered in the non-volatile memory transistor, a high voltage (e.g. 20 $\overline{V}$) is supplied to the bistable circuit, whereby the non-volatile memory transistor stores the data in the bistable circuit. When the data stored in the non-volatile memory transistor is to be returned to the bistable circuit, the switching gate is turned on in response to a control signal. Thus, the data in the non-volatile memory transistor is restored in the bistable circuit. These operations can be easily performed at high speed with simple hardware elements.

10 Claims, 8 Drawing Figures

SEMICONDUCTOR MEMORY DEVICE INCLUDING NON-VOLATILE TRANSISTOR FOR STORING DATA IN A BISTABLE CIRCUIT

BACKGROUND OF THE INVENTION

1. Field of the Invention

The present invention relates to a semiconductor memory, and more particularly to a memory device having a non-volatile function known as a non-volatile random access memory.

2. Description of the Prior Art

A non-volatile random access memory is a memory which has a conventional random access memorizing function and a non-volatile memorizing function. The non-volatile random access memory operates as a random access memory under normal operating conditions. However, when a driving voltage supplied to the memory device drops or when the power supply is turned off, the information stored in the random access memory circuit is transferred to a non-volatile memory circuit. Thereafter, when the driving voltage recovers or when the power supply is turned on, the information is returned to the random access memory circuit. Thus, the information is kept in the memory without destruction for a long period of time.

In the prior art, many transistor elements are required to constitute the non-volatile random access memory cell. Therefore, it is hard to provide a large capacity memory device. On the other hand, a non-volatile random access memory cell with a small number of transistor elements is proposed in U.S. Pat. No. 4,207,615. This memory cell has a non-volatile MOS transistor between one of a pair of load transistors and one of a pair of driver transistors in a flip-flop type RAM memory cell, and further a depletion transistor is added in parallel to the non-volatile MOS transistor. Therefore, impedance mismatching occurs between the two load stages in the flip-flop cell. As a result, the reading and writing speeds in an ordinary random access operation become slow. Furthermore, the proposed memory cell has a shortcoming in that it is difficult to form the cell by means of a complementary MOS (C-MOS) circuit. Therefore, the power consumption of the overall circuit is unavoidably large. Further, in U.S. Pat. No. 4,132,904 two non-volatile MOS transistors are used as driving MOS transistors in a flip-flop memory cell. However, according to this memory cell, reading operations and writing operations are very complex. Namely, the prior art non-volatile memory devices have disadvantages in that many elements are required to constitute the memory cell and in that complicated operations are required.

SUMMARY OF THE INVENTION

An object of the present invention is to provide a non-volatile random access memory device having a memory cell in which reading and writing operations can be performed at a high speed.

Another object of the present invention is to provide a memory device having a non-volatile memorizating function with small power consumption.

Still another object of the present invention is to provide a semiconductor memory device having a random access function and a non-volatile memorizing function and capable of performing a sheltering operation and a recovering (reproducing) operation in a short period of time.

A semiconductor memory device according to the present invention has a plurality of memory cells on a semiconductor chip. Each memory cell has a bistable (e.g. flip-flop) memory circuit and a non-volatile memory circuit. The bistable memory circuit has two output terminals (a true output terminal and a complementary output terminal) and acts as an ordinary random access memory cell when a driving voltage is supplied thereto. The non-volatile memory circuit has at least one non-volatile memory transistor having a control electrode coupled to one of the two output terminals of the bistable circuit and having one end portion coupled to the other output terminal of the bistable circuit. The other end portion of the non-volatile memory transistor receives the driving voltage via a switching gate circuit which is turned on according to a control signal.

In the present invention, the bistable circuit can act as an ordinary random access memory cell in a normal mode. When data is to be sheltered from the RAM cell to the non-volatile memory transistor, a voltage which is higher than the normal driving voltage and which is supplied externally in addition to the normal driving voltage or generated internally in the chip is applied to the bistable circuit, whereby the data voltage at the output terminals of the bistable circuit becomes high enough to enable the non-volatile memory transistor, and the data of the bistable circuit is stored in the non-volatile memory transistor (a data sheltering operation). By applying the control signal to the switching gate circuit, and by applying the normal driving voltage to the bistable circuit, the data stored in the non-volatile memory transistor is rewritten in the bistable circuit, automatically (a data reproduction operation).

Thus, the present invention provides a nonvolatile random access memory device which can hold the data to be manipulated in the bistable circuit for a long period of time with simple hardware elements. Further, the data sheltering operation and the data reproduction operation can be easily performed at high speed. Moreover, since the non-volatile memory transistor is provided outside of the bistable circuit, a C-MOS type flip-flop circuit can be used as the bistable circuit. Therefore, the power consumption can be remarkably reduced.

DETAILED DESCRIPTION OF THE PREFERRED EMBODIMENTS

Figure 1:
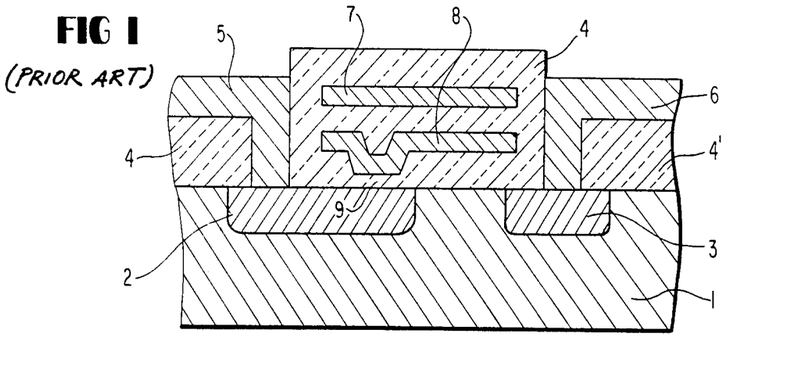
FIG. 1 is a cross-sectional view of a well-known non-volatile memory element.

Firstly, a non-volatile memory element which may be used in the present invention will be explained with reference to FIGS. 1 and 2. FIG. 1 is a crosssectional view of a non-volatile memory transistor. The non-volatile memory transistor of FIG. 1 has an N-type drain region 2 and an N-type source region 3 which are respectively formed in a P-type semiconductor substrate by means of N-type impurity introduction technology. The transistor further has a control gate 7 and a floating gate 8 in a silicon oxide film 4. The floating gate 8 has a bent portion approaching the drain region 2. At the bent portion, at least one portion 9 of the silicon oxide film over the drain region 2 is made selectively thin. As shown in FIG. 1, the control gate 7 and the floating gate 8 are formed so as to cover the channel region between the drain region 2 and the source region 3 and at least one portion of the drain region 2. A drain electrode 5 and a source electrode 6 are connected to the drain and source regions 2 and 3, respectively, and are extended on a field oxide film 4'.

Figure 2:
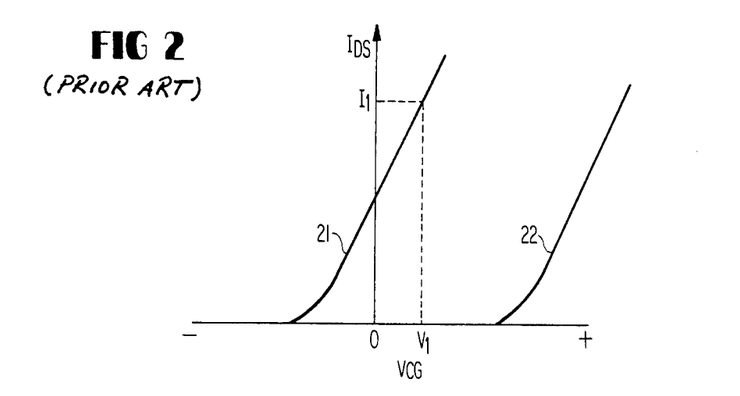
FIG. 2 is a diagram of the characteristics of the element in FIG. 1.

FIG. 2 is a diagram indicating electrical characteristics of the non-volatile memory transistor shown in FIG. 1. The abscissa represents the gate voltage ($V_{CG}$) applied to the control gate 7, and the ordinate represents the drain current ($I_{DS}$) between the drain region 2 and the source region 3, when a constant voltage is applied to the drain region 2 and when a ground potential is applied to the source region 3. In FIG. 1, when the control gate 7 is grounded and a high voltage is applied to the drain region 2, a strong electric field is created in the thin oxide film portion 9 from the drain region 2 toward the floating gate 8. As a result, holes are injected into the floating gate 8. Thus, an N-type inversion layer tends to be formed in the channel region between the drain and the source regions 2 and 3. Therefore, as shown by the curve 21 of FIG. 2, even if a negative voltage is applied to the control gate 7, the drain current flows through the channel region. This means that the non-volatile memory element has a negative threshold voltage. Hereinafter, this condition is called "erasing" or "clearing."

On the other hand, in a writing operation, a high voltage is applied to the control gate 7 and the drain region is grounded. In this condition a strong electric field is created in the thin oxide film portion 9 from the floating gate 8 toward the drain region 2. As a result, electrons are injected into the floating gate 8 to make it difficult to form an inversion layer in the channel region. Therefore, as shown by the curve 22 of FIG. 2, the threshold voltage becomes a high positive value. This condition may be called the data "1" writing condition.

As described above, binary "1" and "0" data can be stored in the non-volatile memory element shown in FIG. 1. When the stored data is read out of the element, a positive voltage $V_1$ lower than the threshold voltage as increased by the writing operation may be applied to the control gate 7. If the element is in the erased condition, it turns on and obtains the drain current $I_1$. If the element is in the written condition, it cannot turn on and the drain current does not flow. That is, the non-conductive condition is maintained.

The non-volatile memory element as described is well known and is disclosed in, for example, *Electronics* pp. 113-117, Feb. 28, 1980, as applied to an EEPROM (electronically erasable programmable read-only memory).

Figure 3:
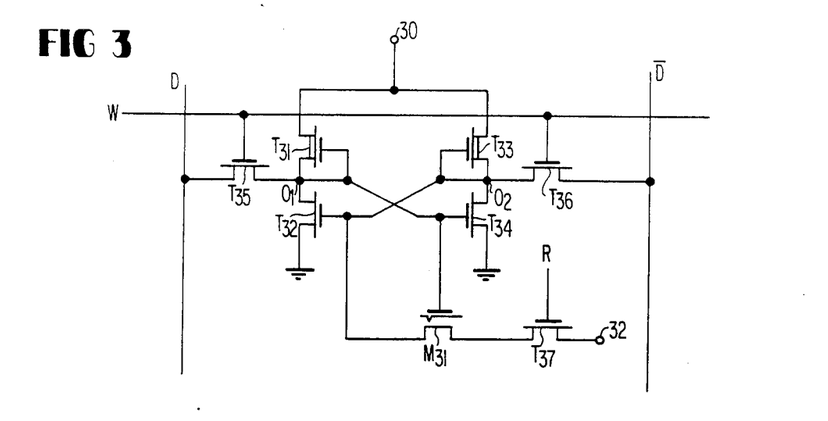
FIG. 3 is a circuit diagram of a memory cell of an embodiment according to the present invention.

Preferred embodiments of the present invention will now be described with reference to the drawings. FIG. 3 is a circuit diagram of a memory cell according to a first embodiment of the present invention in which insulating gate field effect transistors (hereinafter referred to as IGFETs) of N-channel type formed on a P-type semiconductor substrate are used.

IGFET $T_{31}$ of the depletion type and IGFET $T_{32}$ of the enhancement type are connected in series to constitute a first inverter circuit, and IGFET $T_{33}$ of the depletion type and IGFET $T_{34}$ of the enhancement type are connected in series to constitute a second inverter circuit. The two inverter circuits have their respective inputs and outputs cross-coupled, and constitute a bistable (flip-flop) circuit. The depletion type IGFETs $T_{31}$ and $T_{33}$ act as loads and are coupled to the first power supply terminal 30. Further, the two output terminals $O_1$ and $O_2$ of the first and second inverter circuits are coupled to digit (bit) lines D and $\overline{D}$ through IGFETs $T_{35}$ and $T_{36}$ of the enhancement type, respectively. The respective gates of the IGFETs $T_{35}$ and $T_{36}$ are coupled to a word line W to which a decoded address signal is applied. The respective drains of $T_{35}$ and $T_{36}$ are coupled to the digit lines D and $\overline{D}$ to enable data to be written in the bistable circuit or to be read out of the bistable circuit. Complementary data are transferred through the digit lines D and $\overline{D}$, respectively. The output terminal $O_1$ is coupled to the drain of non-volatile memory element $M_{31}$ (for example, the element shown in FIG. 1), while the output terminal $O_2$ is coupled to a control gate of the element $M_{31}$. The source of memory element $M_{31}$ is coupled to the source of an IGFET $T_{37}$ of the enhancement type. The gate of IGFET $T_{37}$ receives a control signal R generated at the timing when data is returned (rewritten) into the bistable circuit. The drain of the IGFET $T_{37}$ is coupled to a second power supply terminal 32. In this embodiment, a constant voltage (a driving voltage of $5\overline{V}$ for instance) may be applied to the second power supply terminal 32.

Firstly, when the non-volatile random access memory cell of FIG. 3 operates as an ordinary static random access memory cell, a voltage ($5\overline{V}$) which can drive the first and second inverter circuits is applied to the first power supply terminal 30 as a normal driving voltage. This voltage may be the same as the constant voltage applied to the second power supply terminal 32. At this time, the signal R is not applied to the IGFET $T_{37}$. That is, the gate of IGFET $T_{37}$ is kept at a low level (ground potential). A normal writing operation is performed in this condition. That is, if the digit lines D and $\overline{D}$ are at a high level (about $5\overline{V}$) and a low level ($0\overline{V}$), respectively, the IGFET $T_{34}$ becomes turned on, while the IGFET $T_{32}$ becomes turned off. Therefore, the bistable circuit stores data "1". On the other hand, if the digit lines D and $\overline{D}$ are at the low level and the high level, respectively, the IGFETs $T_{32}$ and $T_{34}$ are turned on and off, respectively. As a result, data "0" is written in the bistable circuit. In this normal writing operation, though voltages at the output terminals $O_1$ and $O_2$ are supplied to the non-volatile memory element $M_{31}$, their difference is so small that the electric field created between the drain and the control gate of the element $M_{31}$ is weak. Therefore, the "writing" and "erasing" operations in the element $M_{31}$ are not performed because of the weak electric field.

The normal reading operation of the bistable circuit is performed by coupling the output terminals $O_1$ and $O_2$ to the digit lines D and $\overline{D}$, respectively. In order to start the reading operation, the digit lines D and $\overline{D}$ are precharged at, for example, a high ($5\overline{V}$) level by means of a precharge circuit (not shown). Thereafter, the word line W assumes a high level, so that both the IGFETs $T_{35}$ and $T_{36}$ are turned on. Now, if the bistable circuit stores data "1", the output terminals $O_1$ and $O_2$ are at the high level and the low level, respectively. In this condition, the IGFET $T_{32}$ is kept in the turned-off state, while the IGFET $T_{33}$ is kept in the turned-on state. Therefore, the charge on the digit line $\overline{D}$ is discharged to ground through the IGFET $T_{34}$. However, the charge on the digit line D is not discharged because of the turned-off IGFET $T_{32}$. As a result, a high level signal and a low level signal are transferred through the digit lines D and $\overline{D}$, respectively, to a sense amplifying circuit (not shown) coupled to both digit lines D and $\overline{D}$. Thus, the data "1" can be read out. On the other hand, if data "0" is stored in the bistable circuit, only the charge on the digit line D is discharged to ground through the IGFET $T_{32}$. Therefore, the low level signal and the high level signal are transferred to the sense amplifying circuit through the digit lines D and $\overline{D}$, respectively. Thus, the data "0" is read out.

As described above, the circuit of FIG. 3 can be operated as an ordinary random access memory cell by maintaining the signal R for data reproduction at the low (ground) voltage level.

Figure 5:
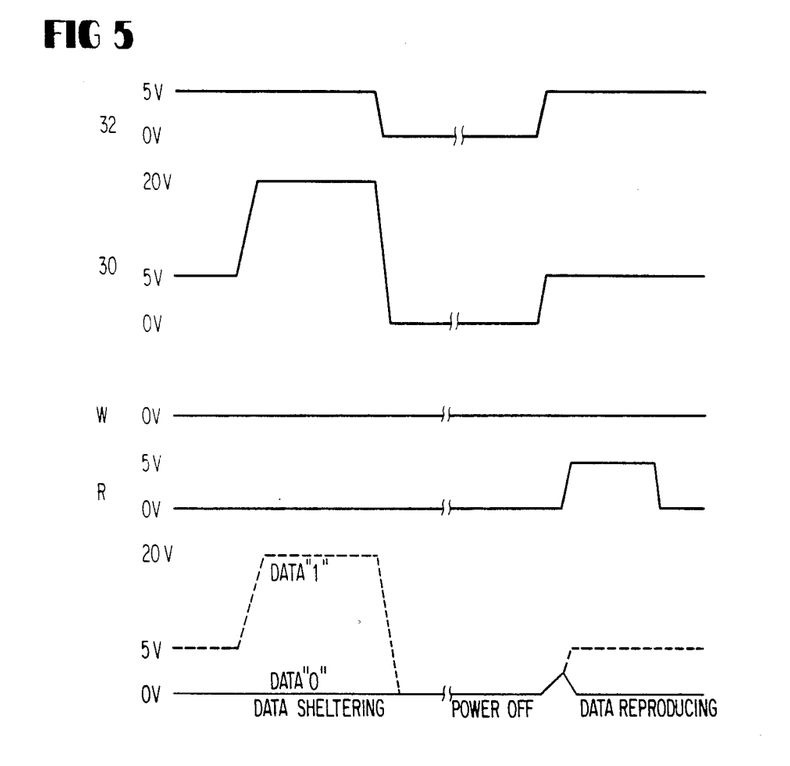
FIG. 5 is a timing chart indicating the sheltering and data reproduction operations in the memory cells of FIGS. 3 and 4.

Next, a sheltering operation will be described. In this operation, the data in the bistable circuit is transferred to the non-volatile memory element $M_{31}$ and is stored therein if the driving voltage is shut off. When the data which is already stored in the bistable circuit is to be sheltered in the non-volatile memory element $M_{31}$, a high voltage (e.g. $20\overline{V}$), different from the normal voltage, is supplied to the first power supply terminal 30 to create a strong electric field, as shown in FIG. 5. At this time, the control signal R for data reproduction is at a low (ground) potential. Thus, if data "1" is stored in the bistable circuit, the IGFET $T_{32}$ is turned on and the IGFET $T_{34}$ is turned off. Therefore, the drain of the element $M_{31}$ is kept at the ground potential, while the high voltage (e.g. $20\overline{V}$) is applied to the control gate of the element $M_{31}$. Thus, a strong electric field from the control gate toward the drain of the element $M_{31}$ is created. As a result, the threshold voltage of the non-volatile memory element $M_{31}$ has a positive value as shown in FIG. 2, e.g., per the "writing operation" curve 22 shown in FIG. 2. On the other hand, if the bistable circuit stores data "0", the IGFET $T_{32}$ is kept in the turned-off state, while the IGFET $T_{34}$ is in the turned-on state. Therefore, to the drain and the control gate of the non-volatile memory element $M_{31}$ are applied the high voltage (about $20\overline{V}$) and the ground voltage ($0\overline{V}$), respectively. Thus, a strong electric field from the drain toward the control gate is created, so that the threshold level of the element $M_{31}$ assumes a negative value, e.g., per the "erasing operation" curve 21 shown in FIG. 2.

As mentioned above, either the "writing operation" or the "erasing operation" can be performed in the non-volatile element $M_{31}$ according to the data stored in the bistable circuit. Therefore, when the driving voltage supplied to the memory device drops or is turned off, the data stored in the bistable circuit can be easily held in the non-volatile memory element $M_{31}$ by supplying to the first power supply terminal 30 a high voltage which can provide a voltage difference at the output terminals $O_1$ and $O_2$ which is high enough to enable the element $M_{31}$.

Next, when data reproduction is required after the driving voltage is reinstated or is turned on, a signal R of a high level is applied to the gate of the IGFET $T_{37}$. As a result, the source of the nonvolatile memory element $M_{31}$ is coupled to the second power supply terminal 32, to which a constant voltage, for example equal to the driving voltage ($5\overline{V}$), is supplied. The word line W is held at the low level, and the digit lines D and $\overline{D}$ are decoupled from the bistable circuit. Further, it is assumed that the threshold level of the first inverter circuit ($T_{31}$ and $T_{32}$) is higher than that of the second inverter circuit ($T_{33}$ and $T_{34}$). In this condition, when the driving voltage (e.g. $5\overline{V}$) is supplied at the first power supply terminal 30, potentials at the output terminals $O_1$ and $O_2$ simultaneously rise. If a writing operation is performed in the non-volatile memory element $M_{31}$, this element does not turn on as shown in FIG. 2 because of the high positive threshold level. The IGFET $T_{34}$ of the second inverter circuit (with the low threshold level) is turned on faster than the IGFET $T_{32}$ of the first inverter circuit. Consequently, the potential at the output terminal $O_2$ assumes the low (ground) level, while the turned-off state of the IGFET $T_{32}$ is maintained. As a result, the output terminal $O_1$ assumes a high level, and the output terminal $O_2$ assumes a low level. Thus, data "1" is restored in the bistable circuit. On the other hand, when the erasing operation has been performed in the non-volatile memory element $M_{31}$, this element $M_{31}$ turns on since the voltage at the control gate becomes higher than the threshold level of the IGFET $M_{31}$. Therefore, the IGFET $T_{32}$ turns on because the constant voltage is applied to the gate of the IGFET $T_{32}$. As a result, the output terminal $O_1$ assumes the low level, while the output point $O_2$ assumes the high level. That is, data "0" is restored in the bistable circuit.

As described in the foregoing, the non-volatile random access memory cell shown in FIG. 3 can act as a normal random access memory cell when a first driving voltage (e.g. $5\overline{V}$) is supplied at the first power supply terminal 30 and when the signal R is not applied to the IGFET $T_{37}$. The cell can also act as a non-volatile memory cell when a second, higher driving voltage (e.g. $20\overline{V}$) is supplied to the first power supply terminal 30. Further, when a driving voltage is resupplied to the first power supply terminal 30 after being cut off and when the switching gate $T_{37}$ is turned on, data sheltered in the non-volatile memory element $M_{31}$ is restored to the bistable circuit. According to this embodiment, these operations can be easily performed by a simple circuit in which only one non-volatile memory element (for example, that shown in FIG. 1) and a switching gate are added to an ordinary static memory cell. Further, the sheltering operation can be quickly performed by supplying a high driving voltage at the first power supply terminal 30. Moreover, during data reproduction (restoring data to the bistable circuit), the signal R is only applied to the switching gate temporarily. Therefore, the controlability of the cell is very high.

Figure 4:
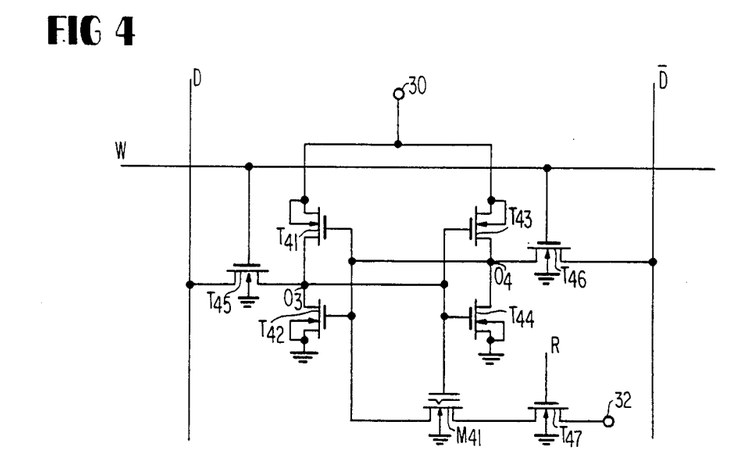
FIG. 4 is a circuit diagram of a memory cell of another embodiment according to the present invention.

FIG. 4 illustrates a non-volatile random access memory cell according to another embodiment of the present invention. In this embodiment, well-known complementary IGFETs (C-MOS FETs) are used in the ordinary static memory cell. As shown in FIG. 4, a first inverter circuit includes a P channel MOS FET $T_{41}$ and an N channel MOS FET $T_{42}$, while a second inverter circuit includes a P channel MOS FET $T_{43}$ and an N channel MOS FET $T_{44}$.

These two C-MOS inverter circuits are coupled to each other in a flip-flop manner. A first output $O_3$ and a second output $O_4$ are coupled to the digit lines D and $\overline{D}$, respectively, via N channel MOS FETs $T_{45}$ and $T_{46}$ used as transfer gates. These two FETs $T_{45}$ and $T_{46}$ are connected to the word line W. A non-volatile memory element $M_{41}$, which is the same as the element $M_{31}$ of FIG. 3, and an N channel MOS FET $T_{47}$ used as a switching gate are also provided. The drain of the element $M_{41}$ is connected to the second output $O_4$, and a control gate of element $M_{41}$ is connected to the output $O_3$. A control signal R is applied to the gate of the FET $T_{47}$, whose drain is coupled to the second power supply terminal 32. The two inverter circuits constitute a bistable circuit which acts as an ordinary random access memory cell and selectively receives a driving voltage (e.g. $5\overline{V}$) and a high voltage (e.g. $20\overline{V}$) at the first power supply terminal 30. In this embodiment, the driving voltage ($5\overline{V}$) is applied to the second power supply terminal 32.

The non-volatile random access memory cell of FIG. 4 operates the same as the memory cell of FIG. 3. That is, in a normal mode, the driving voltage ($5\overline{V}$) is applied to the first power supply terminal 30 and the control signal R is not applied to the FET $T_{47}$. In this condition, when the word line W assumes a high level, reading operations and writing operations are selectively performed. Further, when the high voltage ($20\overline{V}$) is applied to the first terminal 30 and when the switching gate ($T_{47}$) is turned off, the data in the bistable circuit is sheltered and stored in the element $M_{41}$. When the driving voltage is resupplied to the first terminal 30 and when the control signal is applied to the FET $T_{47}$, the data stored in the element $M_{41}$ is rewritten in the bistable circuit. The timing chart of these operations is the same as that in FIG. 5.

Figure 6:
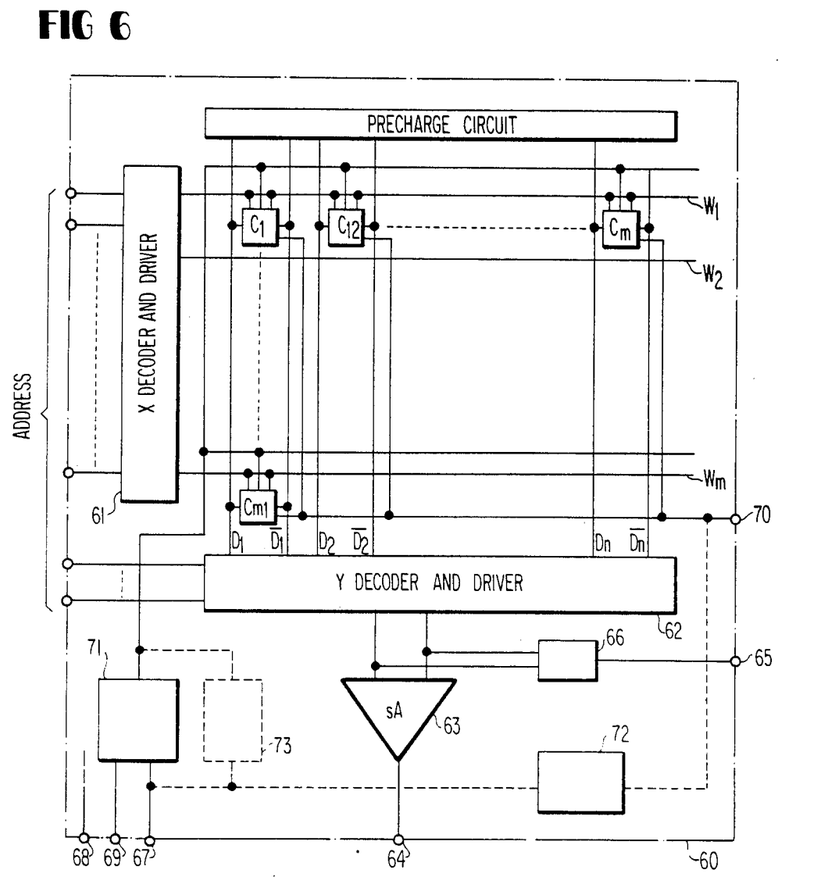
FIG. 6 is a block diagram of a memory device including the memory cells of FIGS. 4 and 5.

FIG. 6 is a circuit diagram of a principal portion of a non-volatile random access memory provided on a single semiconductor chip 60. On the chip 60, $n \times m$ memory cells are arranged in a matrix array. Each cell is the same as that shown in either FIG. 3 or FIG. 4. Address bits are applied to a plurality of address pins; one part being used as word select signals, and the other part being used as column select signals. An X decoder and driver 61 receives the word select bits and produces a word select signal. When n cells ($C_{11}$ to $C_{1n}$) coupled to a selected word line (e.g. $W_1$) are selected, the data stored in the respective cells is simultaneously read out to the digit lines $D_1$ and $\overline{D}_1$, $D_2$ and $\overline{D}_2$, ..., $D_n$ and $\overline{D}_n$, respectively, in a normal read operation mode. A Y decoder and driver 62 select one pair of the digit lines according to the column select bits. The data on the selected digit line pair is amplified by a sense circuit 63 and are output to an output terminal 64. In a normal write operation, data is applied to a write control circuit 66 through a data input terminal 65 and is written into a memory cell selected by the X and Y decoders and drivers. These operations may be the same as that of an ordinary read-write memory device. The chip 60 has a driving voltage supply terminal 67 and a ground voltage supply terminal 68, and further has a high voltage ($20\overline{V}$) supply terminal 69 and a control signal input terminal 70. FIG. 6 does not expressly show the ground line or the line for supplying the constant voltage ($5\overline{V}$) to the switching gate ($T_{37}$, $T_{47}$).

In the case of the sheltering operation, in FIG. 6, the X and Y decoders and drivers 61 and 62 are deactivated, and the high voltage ($20\overline{V}$) is applied to all memory cells through a select circuit 71. As a result, the data of all of the bistable circuits are simultaneously stored in the respective non-volatile memory elements ($M_{31}$, $M_{41}$).

Thereafter, when the data in all the non-volatile memory elements are to be rewritten in the respective bistable circuits, the select circuit 71 selects the terminal 67 to apply the driving voltage to each memory cell, and the control signal R is applied to all switching gates through the terminal 70. Thus, the sheltered data are simultaneously restored in the respective bistable circuits. In this operation, if a power-on reset circuit 72 is provided on the chip 60, a reset signal generated from the circuit 72 may be used as the control signal. Therefore, the control signal input terminal 70 can be omitted.

Figure 7:
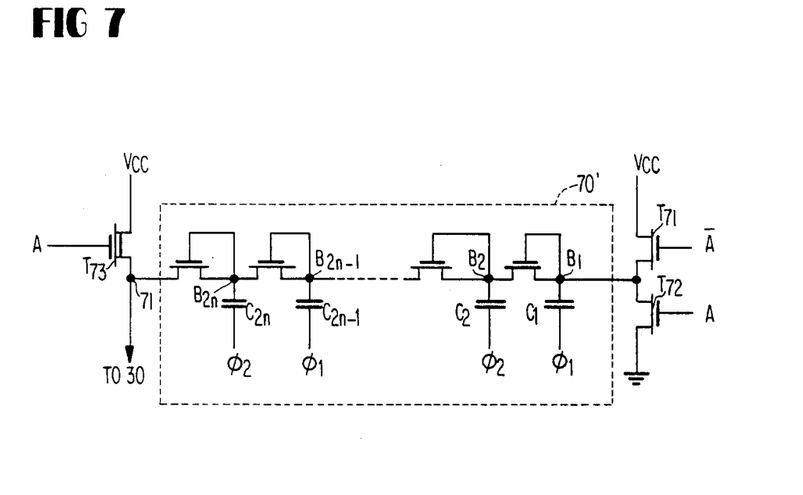
FIG. 7 is a circuit diagram of the high voltage generating circuit in FIG. 6.

Further, if a high voltage generating circuit 73 as shown in, for example, FIG. 7 is provided on the chip 60, the terminal 69 through which a high voltage is supplied to the chip can be omitted. The high voltage generating circuit shown in FIG. 7 includes an N channel IGFET $T_{71}$ whose drain electrode is coupled to the driving voltage source (e.g. the terminal 67 in FIG. 6), an N channel IGFET $T_{72}$ whose drain electrode is coupled to a source electrode of the IGFET $T_{71}$, an N channel depletion type IGFET $T_{73}$ whose drain electrode is coupled to the driving voltage source and whose source electrode is coupled to the first power supply terminal 30 in FIGS. 3 and 4, and a charging circuit 70' in which a plurality of enhancement type IGFETs, whose gate electrodes and drain electrodes are connected to each other, are connected in series. Connection points $B_1$ to $B_{2n}$ of each IGFET are coupled to capacitors $C_1$ to $C_{2n}$, respectively. The IGFET $T_{71}$ receives a control signal $\overline{A}$, which assumes a high level when the sheltering operation is performed, at its gate. The IGFET $T_{72}$ receives an inverted control signal A at its gate. The IGFET $T_{73}$ receives the inverted control signal A at its gate.

Figure 8:
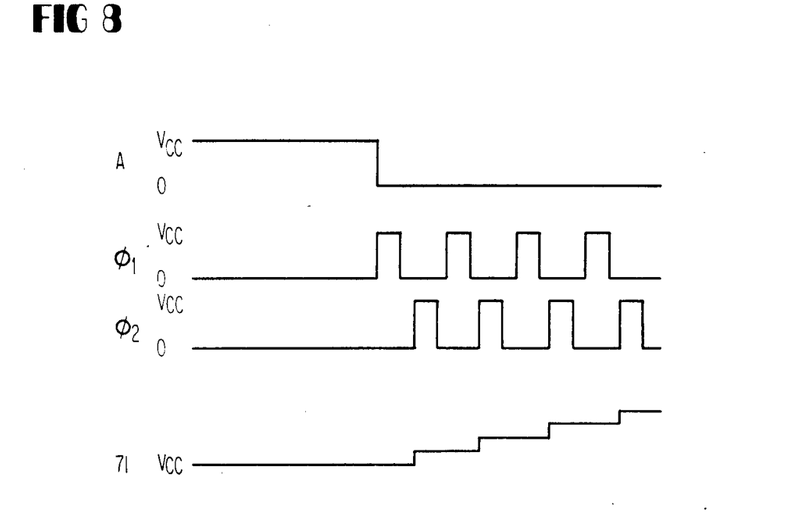
FIG. 8 is an operation timing chart of the device of FIG. 7.

It is assumed that a constant voltage ($V_{CC}=5\overline{V}$) is used as the driving voltage in FIG. 7. A timing chart of the operation of the device of FIG. 7 is shown in FIG. 8.

When the non-volatile random access memory of FIG. 6 acts in the normal mode and in the data reproduction mode, the control signal $\overline{A}$ assumes a low level and the inverted control signal A assumes a high level. As a result, the charging circuit 70' is inactivated, and the depletion type IGFET $T_{73}$ is turned on. Therefore, the voltage $V_{CC}$ is supplied at the first power supply terminal 30.

On the other hand, when the sheltering operation is required, the control signal $\overline{A}$ assumes a high level and the inverted signal A assumes a low level. Consequently, the IGFET $T_{71}$ is turned on, while the IGFET $T_{72}$ is turned off. In this condition, when a clock signal $\phi$ assumes a high level, the potentials on contact portions coupled to capacitors $C_1, C_3, \ldots, C_{2n-1}$ rise, and, therefore, the IGFETs whose gates are coupled to the capacitors $C_1, C_3, \ldots C_{2n-1}$ are biased in a forward direction. As a result, positive potentials are simultaneously transferred from the nodes $B_1, B_3, \ldots, B_{2n-1}$ to the nodes $B_2, B_4, \ldots B_{2n}$, respectively. Thereafter, a clock signal $\phi_2$ assumes a high level. Then, the potential levels at the nodes $B_2, B_4, \ldots, B_{2n}$ rise, respectively. Therefore, the potential levels at the nodes $B_1, B_3, \ldots B_{2n-1}$ become high as shown in FIG. 8. Thus, the source voltage of the IGFET $T_{73}$ becomes higher in a stepwise manner. In this state, the IGFET $T_{73}$ is turned off. Therefore, the source potential of the IGFET $T_{73}$ is not transferred to the constant voltage source $V_{CC}$.

As mentioned above, if the high voltage generating circuit 70' as shown in FIG. 7 is provided on the chip 60, the terminal 69 can be omitted. However, when the high voltage generating circuit of FIG. 7 is coupled to a memory cell in which current flows in an operation mode, the voltage level at the source of the IGFET $T_{73}$ drops. Therefore, the capability of supplying the high voltage level to the non-volatile memory element, for example, $M_{31}$ of FIG. 3, is weakened. However, if the C-MOS memory cell as shown in FIG. 4 is used, the above-mentioned disadvantages can be avoided. In practice, the high voltage generating circuit of FIG. 7 is designed such that $\Delta V_{DD}$ in the clock signal cycle of FIG. 8 is smaller than the threshold voltage of the IGFETs $T_{41}$ or $T_{43}$.

Although N-channel type IGFETs are used in the embodiment in FIG. 3, P-channel type IGFETs can be also used in the same way. Moreover, in the above embodiments, the non-volatile memory element ($M_{31}$, $M_{41}$) is not necessarily limited to the element shown in FIG. 1. It goes without saying that any non-volatile memory element of the so-called electrically rewritable non-volatile type having a variable threshold voltage can be used.

What is claimed:

1. A semiconductor memory device having a plurality of memory cells on a single semiconductor chip, each of said memory cells comprising; a bistable circuit coupled between a reference voltage source and a power supply terminal and having two output terminals, one of said two output terminals being coupled to a true digit line via a first transfer gate, and the other output terminal being coupled to a complementary digit line via a second transfer gate, means for selectively supplying a first voltage or a second voltage higher than said first voltage to said bistable circuit through said power supply terminal, a non-volatile memory transistor having a control electrode coupled to one of said two output terminals of said bistable circuit, and having one of a source and drain coupled to the other of said two output terminals of said bistable circuit, for selectively storing the contents of said bistable circuit, and switching means coupled to the other of said source and drain of said non-volatile memory transistor for applying a driving voltage thereto, and a power-on reset circuit provided on said semiconductor chip and generating a reset signal when power for driving the memory device is supplied to said semiconductor chip, said switching means being activated by said reset signal to apply a driving voltage at the other of said source and drain of said non-volatile memory transistor.

2. A semiconductor memory device as claimed in claim 1, in which said first voltage is applied to said bistable circuit through said power supply terminal when said bistable circuit acts as an ordinary random access memory cell, while said second voltage is applied to said bistable circuit through said power supply terminal when data in said bistable circuit is to be sheltered in said non-volatile memory transistor.

3. A semiconductor device, comprising; a power-on reset circuit generating a reset signal whenever driving power is supplied to the semiconductor device, and at least one memory element, said memory element comprising a flip-flop circuit and a non-volatile transistor having a control electrode and two contact portions which act as a source region and a drain region, respectively, said control electrode of said non-volatile transistor being coupled to one output of said flip-flop circuit, one of said two contact portions of said non-volatile transistor being coupled to the other output of said flip-flop circuit, the other of said two contact portions receiving a driving voltage when data stored in said non-volatile transistor is to be written into said flip-flop circuit, and a switching transistor receiving said driving voltage at one terminal and being connected at another terminal to said non-volatile transistor, and being turned on in response to said reset signal generated by said power-on reset circuit; and said flip-flop circuit receiving a control voltage which can activate said non-volatile transistor when data in said flip-flop is to be stored in said non-volatile transistor.

4. A semiconductor device as claimed in claim 3, wherein said flip-flop circuit comprises two inverters of a complementary type, an input of one inverter being coupled to an output of the other inverter and an input of said other inverter being coupled to an output of said one inverter.

5. A semiconductor memory device as claimed in claim 1, wherein said non-volatile memory transistor comprises a dual gate device having a floating gate having at least one portion arranged proximate a drain region, and a control gate disposed above said floating gate, said non-volatile memory transistor performing a writing operation to store the contents of said bistable circuit upon the application of said second voltage across said control gate and said drain region.

6. A semiconductor memory device as claimed in claim 1, wherein said bistable circuit comprises a flip-flop circuit constituted of a pair of cross connected inverters, each of said inverters comprising a series connected depletion type IGFET and an enhancement type IGFET.

7. A semiconductor memory device as claimed in claim 6, wherein said bistable circuit comprises a flip-flop circuit constituted of a pair of cross-coupled inverters, each of said converters comprising a series connected P-channel MOSFET and N-channel MOSFET.

8. A semiconductor memory device as claimed in claim 1, wherein said means for selectively supplying comprises a select circuit disposed on said chip for selecting between a source of said first voltage and a source of said second voltage, both of said sources being located externally of said chip.

9. A semiconductor memory device as claimed in claim 1 further comprising means for generating said second voltage located on said chip, said second voltage generating means comprising a terminal for receiving said first voltage, a pair of serially connected transistors respectively receiving true and complemented control signals, a charging circuit connected between said transistors, a further transistor coupled between a source of said first voltage and an output of said charging circuit and receiving said true control signal, and an output terminal connected to said bistable circuits of said memory cells.

10. A semiconductor memory device as claimed in claim 9, wherein said charging circuit comprises a plurality of serially connected IGFETs having interconnected gates and drains, and a charging capacitor coupled to each said gate.

* * * * *

UNITED STATES PATENT AND TRADEMARK OFFICE
CERTIFICATE OF CORRECTION

PATENT NO.   :   4,635,229
DATED        :   January 6, 1987
INVENTOR(S)  :   Koichiro Okumura et al It is certified that error appears in the above-identified patent and that said Letters Patent is hereby corrected as shown below:

Column 1, line 61, delete "memorizating" insert --memorizing--.

Signed and Sealed this

Fifteenth Day of December, 1987

Attest:

DONALD J. QUIGG

*Attesting Officer*   *Commissioner of Patents and Trademarks*